(12) United States Patent
Kothandaraman et al.

(10) Patent No.: US 7,960,809 B2
(45) Date of Patent: Jun. 14, 2011

(54) EFUSE WITH PARTIAL SIGE LAYER AND DESIGN STRUCTURE THEREFOR

(75) Inventors: Chandrasekharan Kothandaraman, Hopewell Junction, NY (US); Deok-kee Kim, Bedford Hills, NY (US); Dureseti Chidambarrao, Weston, CT (US); William K. Henson, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 286 days.

(21) Appl. No.: 12/354,996

(22) Filed: Jan. 16, 2009

(65) Prior Publication Data
US 2010/0181643 A1    Jul. 22, 2010

(51) Int. Cl.
H01L 29/00    (2006.01)
(52) U.S. Cl. ...................................................... 257/529
(58) Field of Classification Search ........... 257/528–543
See application file for complete search history.

(56) References Cited

U.S. PATENT DOCUMENTS

| | | |
|---|---|---|
| 4,679,310 A | 7/1987 | Ramachandra et al. |
| 5,365,105 A | 11/1994 | Liu et al. |
| 5,969,404 A | 10/1999 | Bohr et al. |
| 6,204,132 B1 | 3/2001 | Kittl et al. |
| 6,274,440 B1 | 8/2001 | Arndt et al. |
| 6,326,289 B1 | 12/2001 | Rodder et al. |
| 6,384,664 B1 | 5/2002 | Hellums et al. |
| 6,507,087 B1 | 1/2003 | Yu |
| 6,624,499 B2 | 9/2003 | Kothandaraman et al. |
| 6,642,601 B2 | 11/2003 | Marshall et al. |
| 6,661,330 B1 | 12/2003 | Young |
| 6,958,523 B2 | 10/2005 | Babcock et al. |
| 6,982,610 B2 | 1/2006 | Govind |
| 6,984,550 B2 | 1/2006 | Yamazaki et al. |
| 7,067,359 B2 | 6/2006 | Wu |
| 7,242,072 B2 * | 7/2007 | Kothandaraman et al. ... 257/529 |
| 7,381,594 B2 | 6/2008 | Hsu et al. |
| 2003/0160297 A1 | 8/2003 | Kothandaraman et al. |
| 2007/0082431 A1 | 4/2007 | Hoefler et al. |
| 2008/0067629 A1 | 3/2008 | Miyashita |
| 2008/0169529 A1 * | 7/2008 | Kim et al. ..................... 257/529 |

OTHER PUBLICATIONS

C. Kothandaraman, et al.—"Electrically Programmable Fuse (eFUSE) Using Electromigration in Silicides"—IEEE Electron Device Letters, vol. 23, No. 9, Sep. 2002, pp. 523-525.
C. Kothandaraman, et al.—"Electrically Programmable Fuse (eFUSE) Using Electromigration in Silicides"—IEEE—2002—pp. 523-525.

* cited by examiner

*Primary Examiner* — Cuong Q Nguyen
(74) *Attorney, Agent, or Firm* — Joseph P. Abate

(57) ABSTRACT

A fuse includes a fuse link region, a first region and a second region. The fuse link region electrically connects the first region to the second region. A SiGe layer is disposed only in the fuse link region and the first region.

20 Claims, 16 Drawing Sheets

EFUSE WITH PARTIAL SIGE LAYER AND DESIGN STRUCTURE THEREFOR

BACKGROUND OF THE INVENTION

1. Technical Field of the Invention

The invention relates generally to the field of integrated circuits and, more particularly, to an eFuse, and to design structures therefor.

2. Description of Related Art

In integrated circuits including CMOS integrated circuits, it is often desirable to be able to permanently store information, or to form permanent connections of the integrated circuit after it is manufactured. Fuses or devices forming fusible links are frequently used for this purpose. Fuses can also be used to program redundant elements to replace identical defective elements, for example. Further, fuses can be used to store die identification or other such information, or to adjust the speed of a circuit by adjusting the resistance of the current path.

One type of fuse device is "programmed" or "blown" using a laser to open a link after a semiconductor device is processed and passivated. This type of fuse device requires precise alignment of the laser on the fuse device to avoid destroying neighboring devices. This and other similar approaches can result in damage to the device passivation layer, and thus, lead to reliability concerns. For example, the process of blowing the fuse can cause a hole in the passivation layer when the fuse material is displaced.

Another type of fuse device 30, illustrated in plan view in FIG. 1A and cross-section view in FIG. 1B through line A-A', and cross-section view in FIG. 1C through line B-B', is based on rupture or agglomeration or electromigration of silicided polysilicon. These types of fuses include a silicide layer 20 disposed on a polysilicon layer 18, overlain by a layer of silicon nitride 24. Contacts 25 are coupled to the silicide layer 20 in a pair of contact regions 22 on either side of a fuse element 27 to provide an electrical connection between the fuse and external components for programming and sensing.

FIG. 1A illustrates a top view of a typical shape of the device 30, and includes the fuse element 27 and contact regions 22. Conventional signal (e.g. voltage) sensing circuitry SC is also shown schematically.

FIG. 1B shows a side view of a typical fuse construction in which the polysilicon layer 18 and the silicide layer 20 are provided at a uniform thickness disposed on an oxide layer 10 also of a uniform thickness. FIG. 1C illustrates a cross-section through the fuse link region 27. Generally, a blanket nitride capping layer 24 is also provided over layers 20 and 18.

The silicide layer 20 has a first resistance and the polysilicon layer 18 has a second resistance which is greater than the first resistance. In an intact condition, the fuse link has a resistance determined by the resistance of the silicide layer 20. In common applications, when a programming potential is applied, providing a requisite current and voltage over time across the fuse element 27 via the contact regions 22, the silicide layer 20 begins randomly to "ball-up"—eventually causing an electrical discontinuity or rupture in some part of the silicide layer 20. Thus, the fuse link 27 has a resultant resistance determined by that of the polysilicon layer 18 (i.e. the programmed fuse resistance is increased to that of the second resistance). However, this type of fuse device can result in damage to surrounding structure and/or suffers from unreliable sensing because of the inconsistent nature of the rupture process and the relatively small change typically offered in the programmed resistance. Further, these types of devices may not be viable for use with many of the latest process technologies because of the required programming potentials, i.e. current flow and voltage levels over a requisite amount of time.

In the electromigration type of fuse, a potential is applied across the conductive fuse link via a cathode and an anode in which the potential is of a magnitude and direction to initiate electromigration of silicide from a region of the semiconductor fuse reducing the conductivity of the fuse link. The electromigration is enhanced by commencing a temperature gradient between the fuse link and the cathode responsive to the applied potential.

See also, for example: U.S. Pat. No. 6,624,499 B2, SYSTEM FOR PROGRAMMING FUSE STRUCTURE BY ELECTROMIGRATION OF SILICIDE ENHANCED BY CREATING TEMPERATURE GRADIENT, issued Sep. 23, 2003, by Kothandaraman et al., and "Electrically Programmable Fuse (eFuse) Using Electromigration in Silicides", by Kothandaraman et al., IEEE Electron Device Letters, Vol. 23, No. 9, September 2002, pp. 523-525, and "EFUSE ON SIGE-SILICON STACK", Ser. No. 11/622,616, filed Jan. 12, 2007, by Deok-Kee Kim, Dureseti Chidambarrao, William K. Henson and Chandrasekharan Kothandaraman, which are all incorporated in their entireties herein by reference.

Even with this electromigration type of fuse, the programming of the fuse is still dominated by the thermal gradients established in the fuse material. Because the fuse material is essentially uniformly continuous resulting in inadequate gradients, the final resistance is not very high and the achieved resistance has a wide distribution. This resistance sometimes results in a programmed fuse being sensed incorrectly and, thus, leading to the failure of the chip.

Therefore, a need exists for a programming apparatus and method which reduces the variability of programming inherent in fuses formed with essentially uniformly continuous materials.

Furthermore, it is desirable to reduce the energy required to program the fuse. It is additionally desirable to have a significant difference in resistance between the programmed and the un-programmed state.

There is also a need to shrink the area occupied by the support circuitry.

SUMMARY OF THE INVENTION

The present invention is directed to an electrically programmable fuse including in a preferred embodiment a silicide layer, a partial SiGe layer, and a silicon layer, and to design structures therefor. The SiGe and silicon layers can be either single crystalline or poly crystalline. The silicide layer is disposed or formed onto the partial SiGe layer. The silicide, partial SiGe and silicon layers form a fuse link region electrically connected to a first contact region at a first end of the fuse link region and a second contact region at the opposing end of the fuse link region. The partial SiGe layer is deposed only in the fuse link region and the first contact region. The substrate can be either a silicon-on-insulator wafer or a bulk silicon wafer. In operation, the fuse is programmed by applying a positive (+) potential to the first contact region which then functions as an anode.

The fuse of the present invention has the advantage that it can be successfully programmed over a wide range of programming voltages and time. The thermal conductivity of Si is 1.3 W/cm K and that of SiGe is 0.1 W/cm K and is shown, for example, in the charts of FIG. 10. The partial SiGe layer below the silicide layer provides much improved thermal insulation required for successful programming without special control effort. In the present inventors' opinion, the inhomgeniety achieved by the partial SiGe layer increases current crowding and thermal gradients that are established during fuse programming. These increases result in improved programming characteristics such as increased final resistance and improved programming uniformity, both facilitating easier sensing of the programmed eFuse.

1-D thermal diffusion equation is as follows:

$$\frac{\partial T}{\partial t} = \alpha \frac{\partial^2 T}{\partial x^2},$$

where $$\alpha = \frac{k}{\rho c_p}$$

(thermal diffusivity) and k, $\rho$ and $c_p$ (thermal conductivity, density, specific heat)

Thermal diffusivity of Si is 0.8 cm$^2$/sec and that of SiGe is 0.36 cm$^2$/sec. Electromigration, which is the diffusion of atoms due to electron wind force, is easier with the lower melting temperature of SiGe compared to Si. The SiGe layer below the silicide layer improves eFuse programming in at least three ways: lower thermal conductivity, lower thermal diffusivity, and lower melting temperature. In general, an average temperature at the fuse link region is higher than an average temperature at the second contact region (which does not include SiGe) resulting in an enhanced temperature gradient that further results in improved programming characteristics. The voltage, current and time needed to program the inventive fuse are small, which results in significant savings in area.

BRIEF DESCRIPTION OF THE DRAWINGS

For a more complete understanding of the present invention, reference is made to the following detailed description taken in conjunction with the accompanying drawings, which are not necessarily drawn to scale, wherein.

DETAILED DESCRIPTION OF THE PREFERRED EMBODIMENTS

Figure 1A:
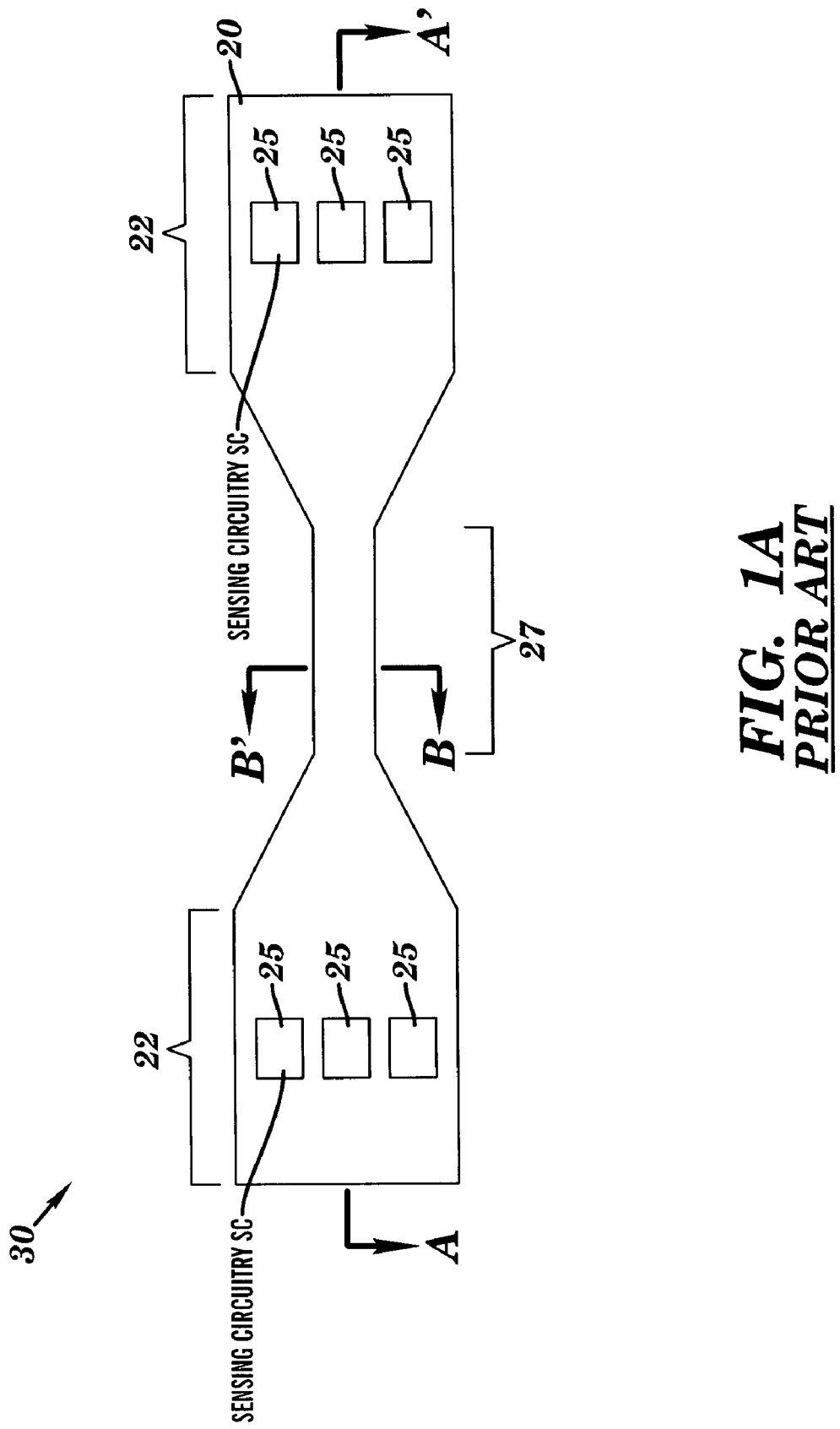
FIG. 1A illustrates a plan view of the conventional fusible link device 30.
Figure 1B:
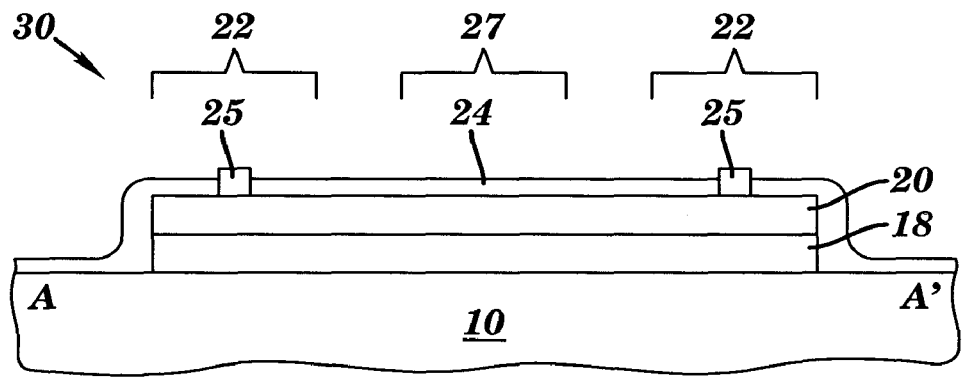
FIG. 1B illustrates a first cross-sectional view of the conventional fusible link device 30.
Figure 1C:
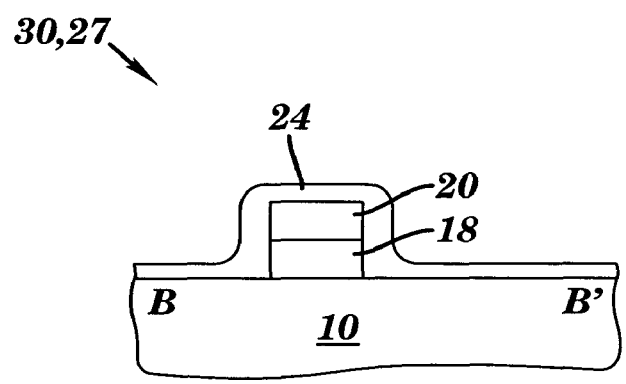
FIG. 1C illustrates a second cross-sectional view of the conventional fusible link device 30.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout FIGS. 2-10 of the drawings, it is noted that the same reference numerals or letters will be used to designate like or equivalent elements having the same function. Detailed descriptions of known functions and constructions unnecessarily obscuring the subject matter of the present invention have been omitted for clarity. The drawings are provided to aid in understanding the present invention, and are not necessarily drawn to scale.

The present invention is directed to an electrically programmable fuse including a silicide layer, a partial SiGe layer, and a silicon layer. The SiGe and silicon layers are either single crystalline or poly crystalline. The silicide is disposed or formed onto the silicon layer partially covered by the SiGe layer. The fuse includes first and second contact regions FR, SR and a link region LR, with only the first region and the link region containing SiGe. The second region at the opposing end of the link region does not contain SiGe. See, for example, FIG. 7B. In normal operation of the fuse, the first region further includes a contact and other materials to form a first contact region which is biased positively with reference to the second contact region (FIG. 8B) during, for example, programming. The substrate can be either silicon-on-insulator or bulk silicon wafers.

Figure 10:
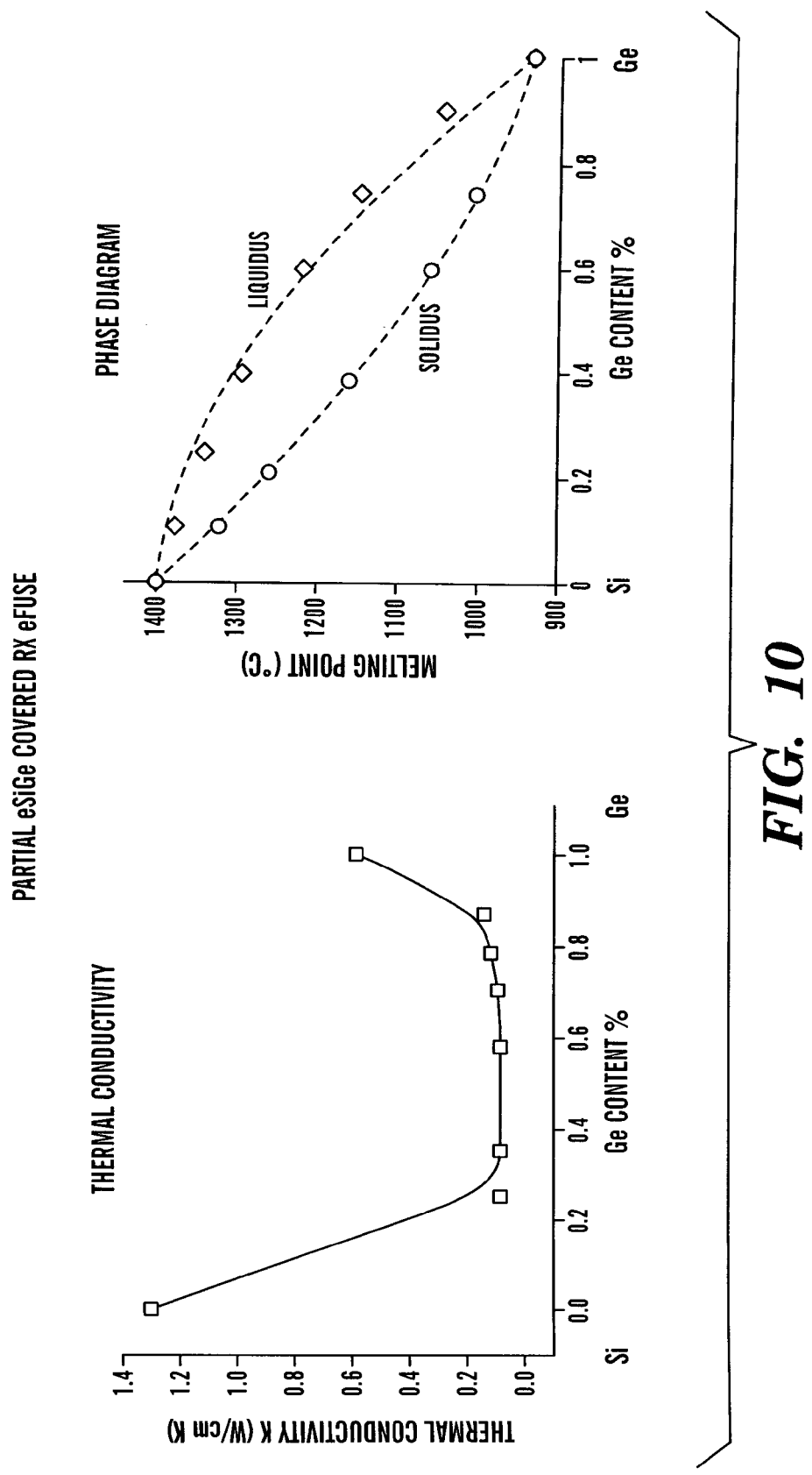
FIG. 10 are charts showing parametrics of materials of the present invention.

The fuse of the present invention has the advantage that it can be successfully programmed over a wide range of programming voltages and time. The thermal conductivity of Si is 1.3 W/cm K but can be lowered by combining with Germanium to 0.1 W/cm K. as shown in FIG. 10. The SiGe layer, present only in the link region and in the first contact region (anode region), below the silicide provides much improved thermal insulation thus resulting in a large thermal gradient required for successful programming without special control effort.

1-D thermal diffusion equation is as follows:

$$\frac{\partial T}{\partial t} = \alpha \frac{\partial^2 T}{\partial x^2},$$

where $$\alpha = \frac{k}{\rho c_p}$$

(thermal diffusivity) and k, $\rho$ and $c_p$ (thermal conductivity, density, specific heat)

Thermal diffusivity of Si is 0.8 cm$^2$/sec and that of SiGe is 0.36 cm$^2$/sec. Electromigration, which is the diffusion of atoms due to electron wind force, is easier with the lower melting temperature of SiGe compared to Si. The partial SiGe layer 50 below silicide 60 improves eFuse programming in multiple ways: lower thermal conductivity, lower thermal diffusivity, lower melting temperature, and increased temperature gradient during programming. The maximum temperature in the fuse link (for the same geometry and current density) is achieved much easier with the partial SiGe layer below the silicide. Also, an increased thermal gradient is produced between the cathode region and the fuse link region and this gradient enhances electromigration. The voltage, current and time needed to program the inventive fuse are small, which results in significant savings in area.

A preferred embodiment of the present invention is further described below. The embodiment is shown formed on an silicon-on-insulator (SOI) substrate or wafer. However, the substrate can be either a SOI or a bulk silicon wafer. The fuse according to the preferred embodiment of the invention includes a silicide layer 60, an epitaxially grown single/poly crystal SiGe layer 50, a single/poly crystalline silicon layer 40 and a BOX (buried oxide) layer 20. The layer 40 is formed on the layer 20, the layer 50 is formed on the layer 40, and the layer 60 is formed on the layer 50, as shown in the cross-sectional views of FIG. 6B and FIG. 7B. The SiGe layer 50 is disposed in only the link region LR and part of the first region FR. See FIG. 7B.

FIGS. 2-8 show the process steps for forming the preferred embodiment of the invention. Alternative features of the preferred embodiment include a silicide, a polycrystalline SiGe, and a polycrystalline silicon on a STI (shallow trench isolation) layer (not shown).

PREFERRED EMBODIMENTS

Figure 2A:
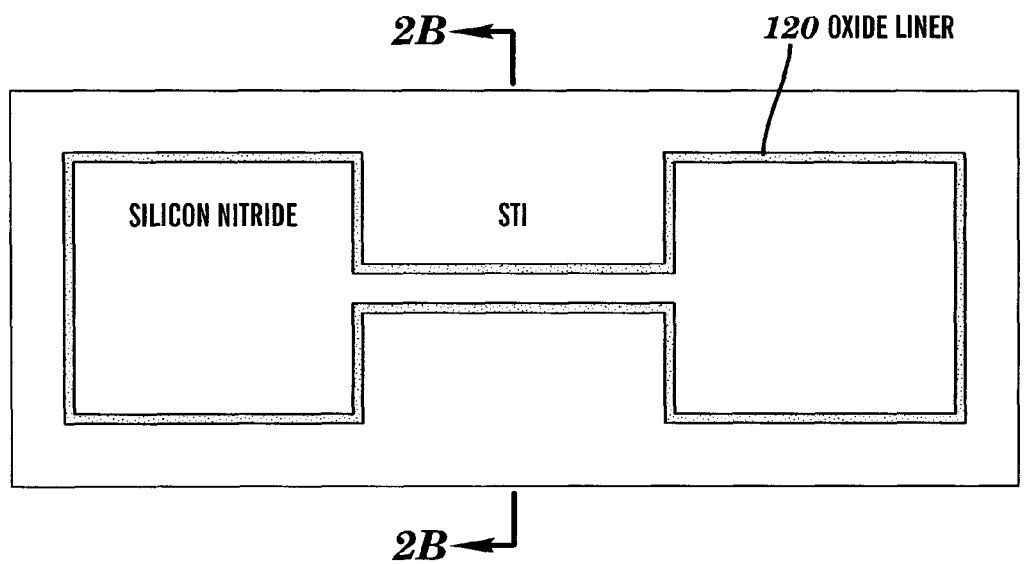
FIG. 2A is a top plan view of an initial structure for forming a fuse according to a preferred embodiment of the present invention.
Figure 2B:
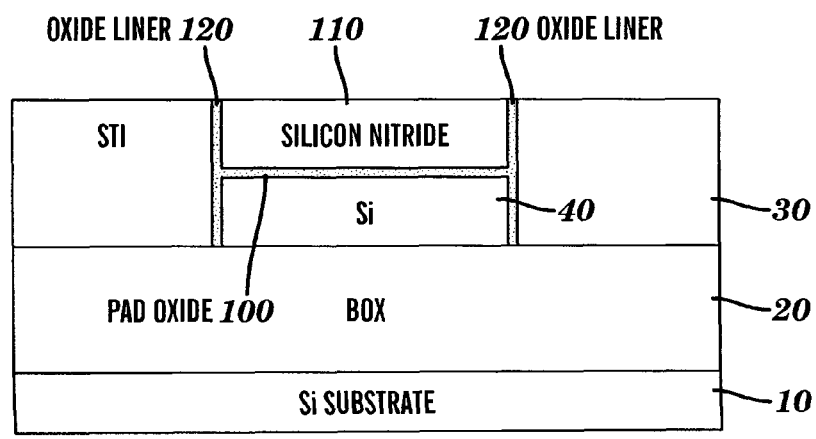
FIG. 2B is a cross-sectional view through the dashed line 2B-2B.

FIGS. 2A and 2B illustrate a plan view and a cross-sectional view of an intermediate structure for an electrically programmable fuse (hereinafter referred to as an eFuse) after a conventional shallow trench isolation (STI) formation 30, by well known techniques which need not be further described in accordance with the embodiment of the present invention. A pad oxide (~50 A) 100 is conventionally grown on an SOI wafer 10, 20, 40 and a pad nitride (between 1000 A-2000 A) 110 is deposited as shown using LPCVD (low pressure chemical vapor deposition). After an area (which will form STI regions) is patterned (conventionally) and etched using RIE (reactive ion etching), a thin oxide liner 120 (~100 A) is thermally grown in a furnace (not shown) and a thin nitride liner is deposited using LPCVD. After that, an oxide to form STI regions 30 is deposited conventionally either by LPCVD or HDPCVD (high density plasma chemical vapor deposition). The extra oxide and nitride on top of the pad nitride 110 is removed by CMP (chemical mechanical polishing).

Figure 3A:
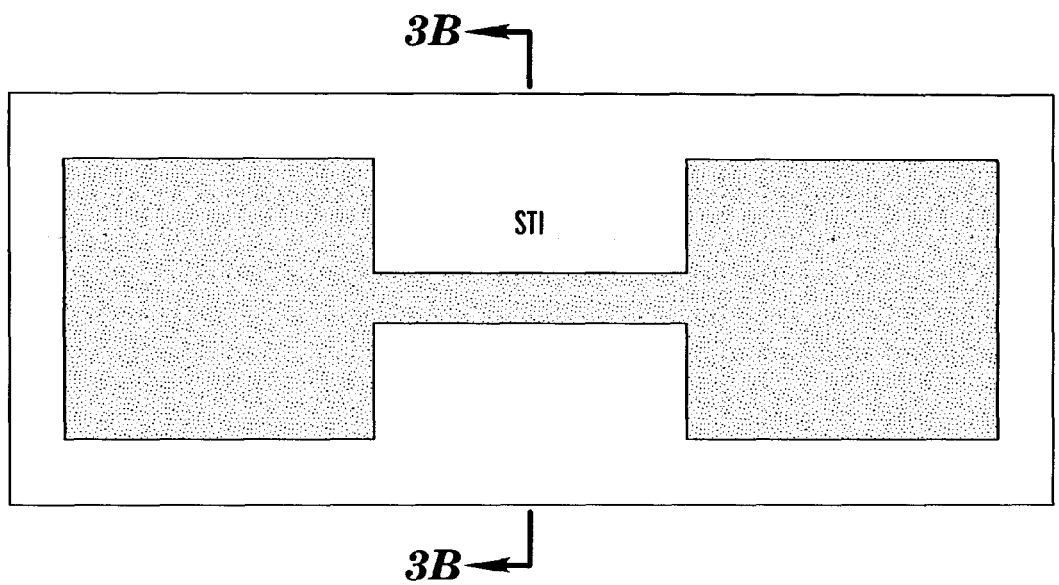
FIG. 3A is a top plan view of an intermediate structure for forming a fuse according to the preferred embodiment of the present invention.
Figure 3B:
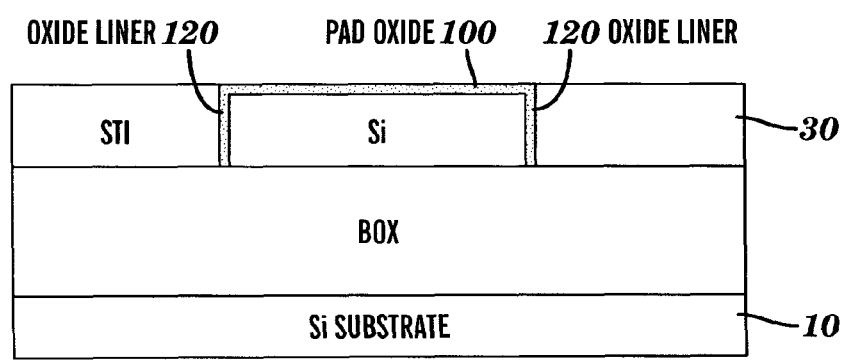
FIG. 3B is a cross-sectional view through the dashed line 3B-3B.
Figure 4A:
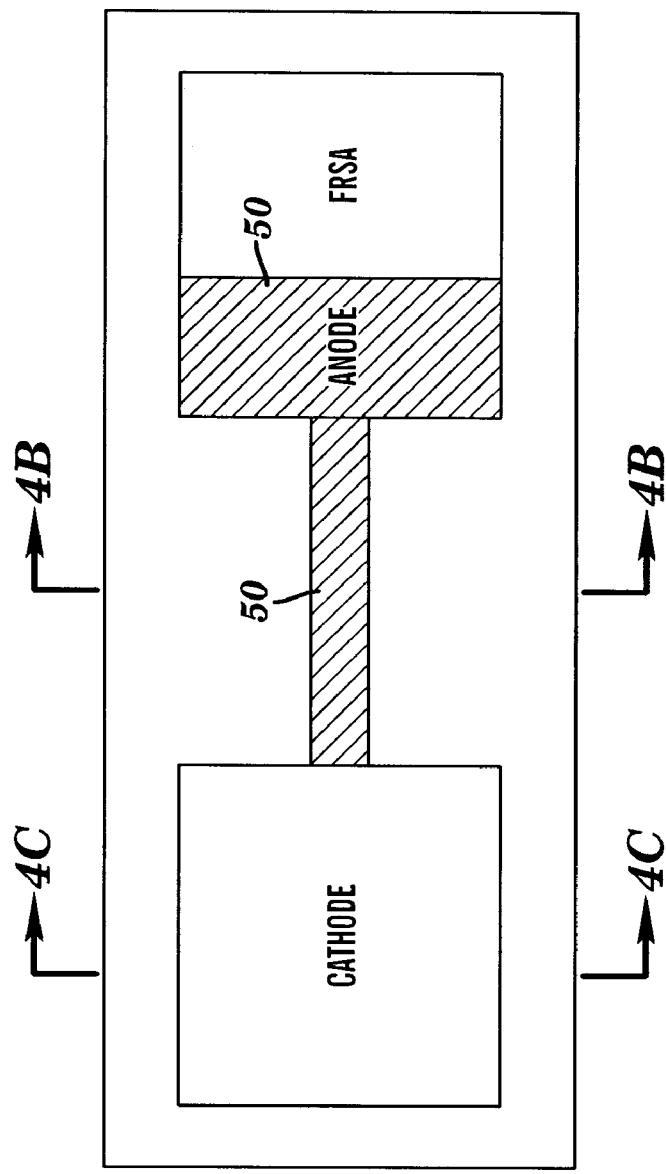
FIG. 4A is a top plan view of a further intermediate structure for forming a fuse according to the preferred embodiment of the present invention, identifying the prospective anode and cathode.
Figure 4C:
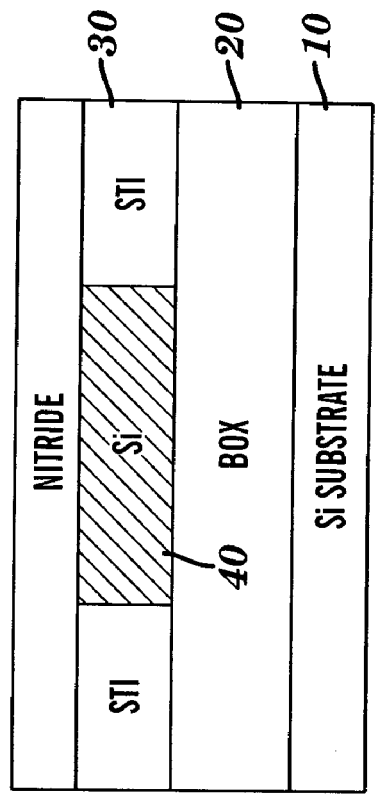
FIG. 4C is a cross-sectional view through the dashed line 4C-4C.
Figure 4B:
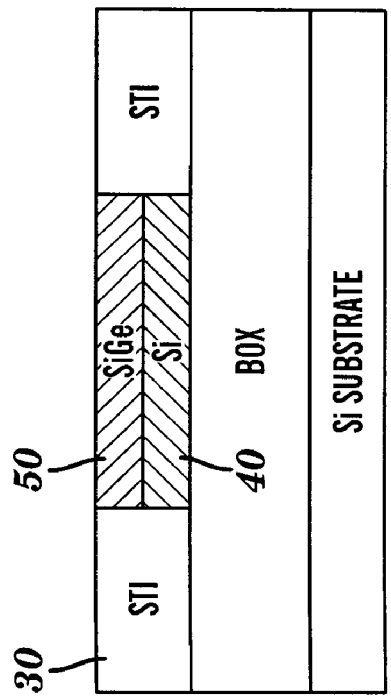
FIG. 4B is a cross-sectional view through the dashed line 4B-4B; the widths of the layers 40, 50 being shown in FIGS. 4B, 5B and 6B substantially wider than would be present in a typical embodiment.
Figure 5A:
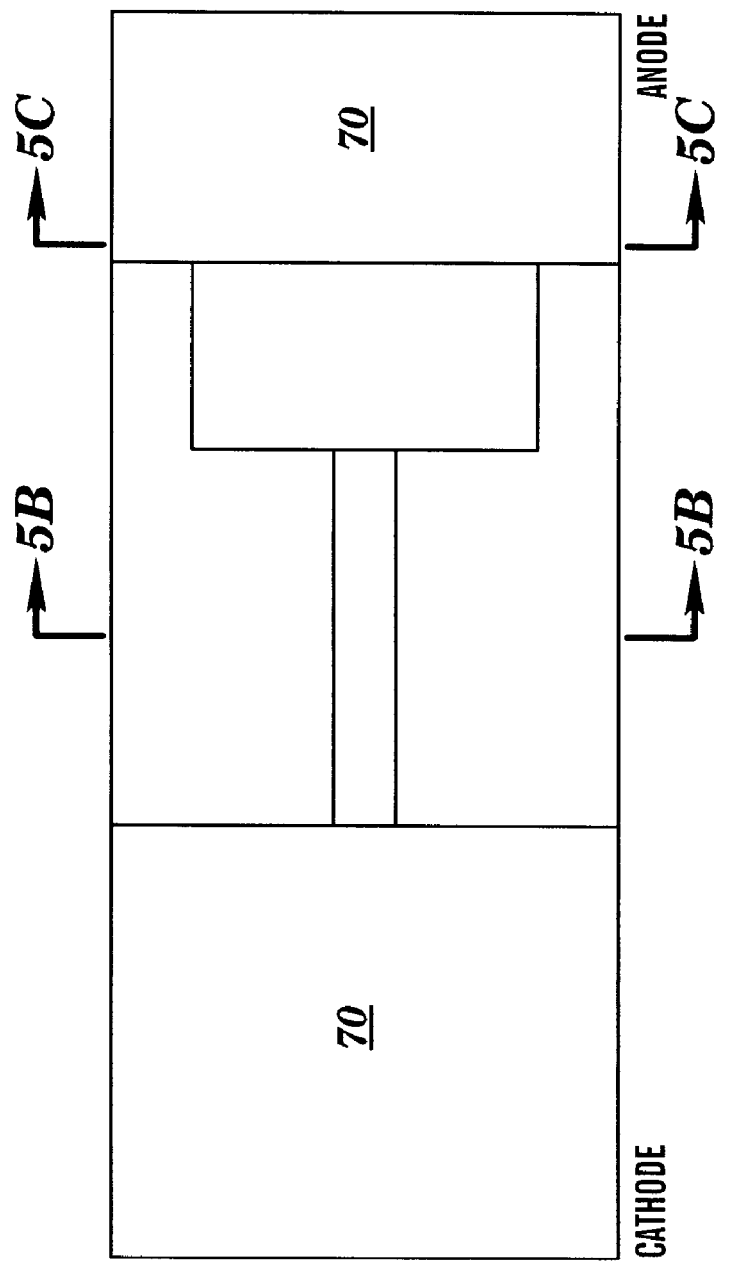
FIG. 5A is a top plan view similar to FIG. 4A, but more clearly showing a nitride deposition step.
Figure 5C:
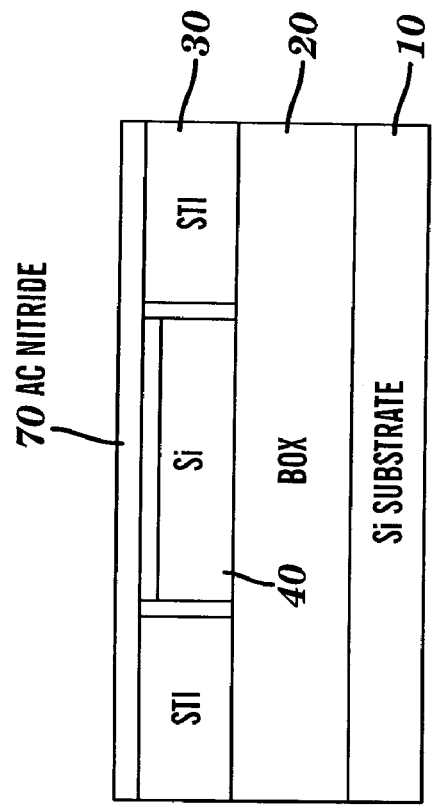
FIG. 5C is a cross-sectional view through the dashed line 5C-5C.
Figure 5B:
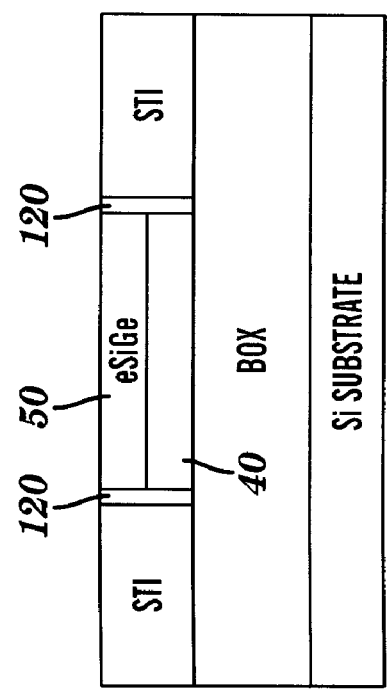
FIG. 5B is a cross-sectional view through the dashed line 5B-5B.

The STI oxide 30 is recessed approximately 10-50 nm before removing the pad nitride using wet etching (hot phosphoric acid—H3PO4, etc.). The pad nitride 110 is removed and conventional polysilicon conductor formation processes including necessary carrier implants are performed in a non-fuse area. The top down and cross-sectional views of an intermediate structure for an eFuse after conventional poly conductor formation are shown in FIGS. 3A and 3B.

Figure 6A:
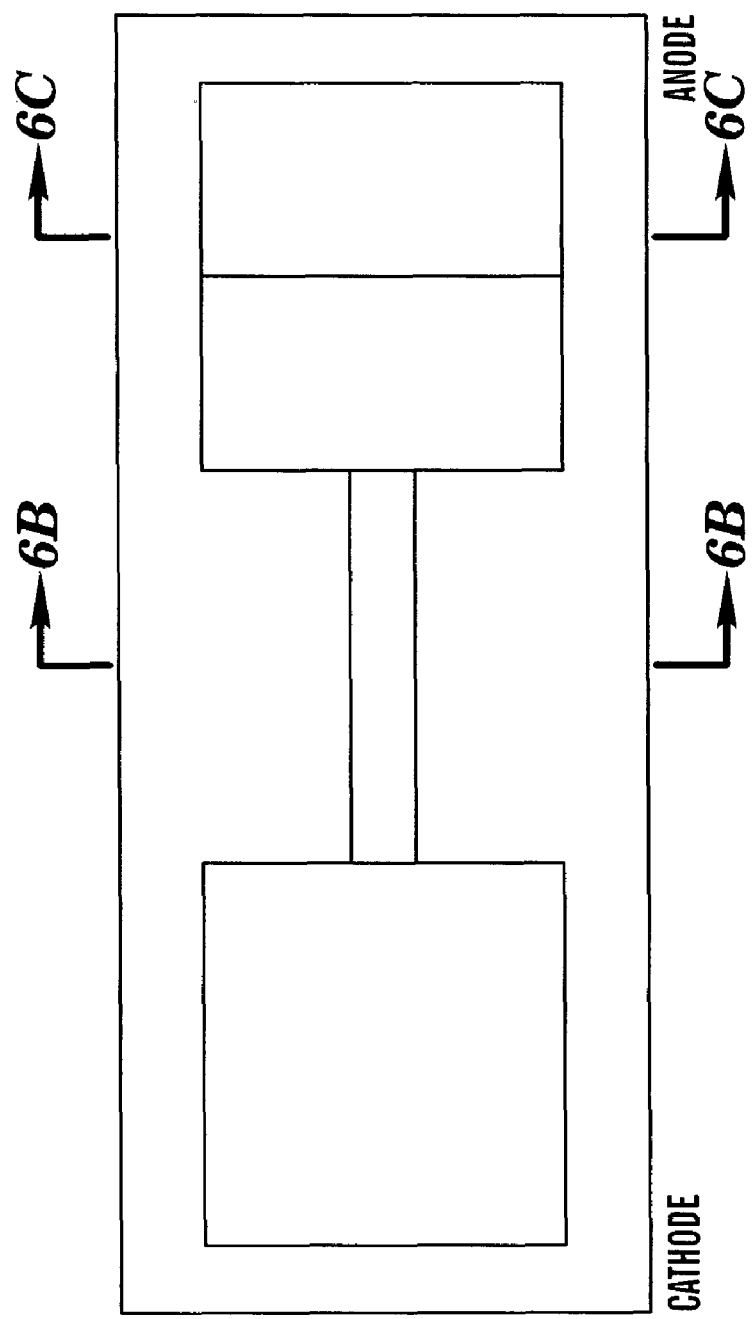
FIG. 6A is a top plan view of further intermediate structure with nitride removed and silicide formed.
Figure 6C:
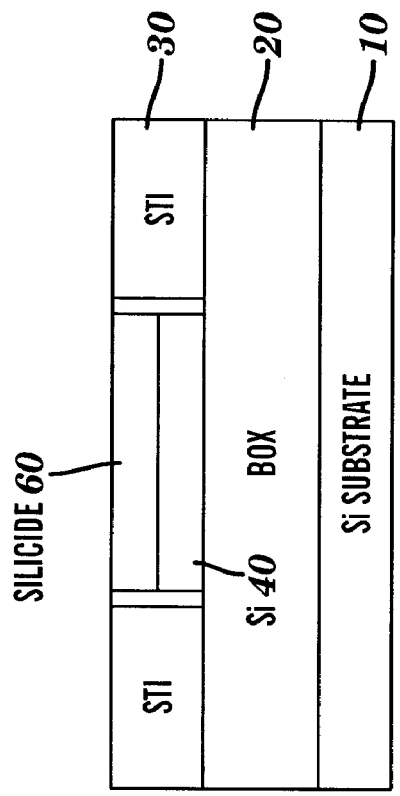
FIG. 6C is a cross-sectional view through the dashed line 6C-6C.
Figure 6B:
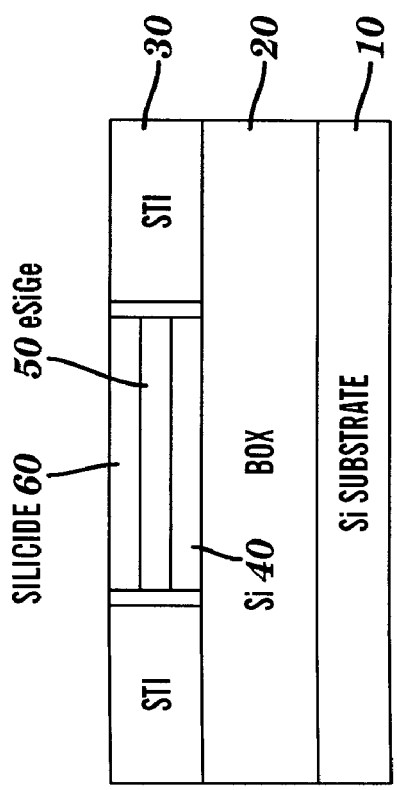
FIG. 6B is a cross-sectional view through the dashed line 6B-6B.
Figure 7A:
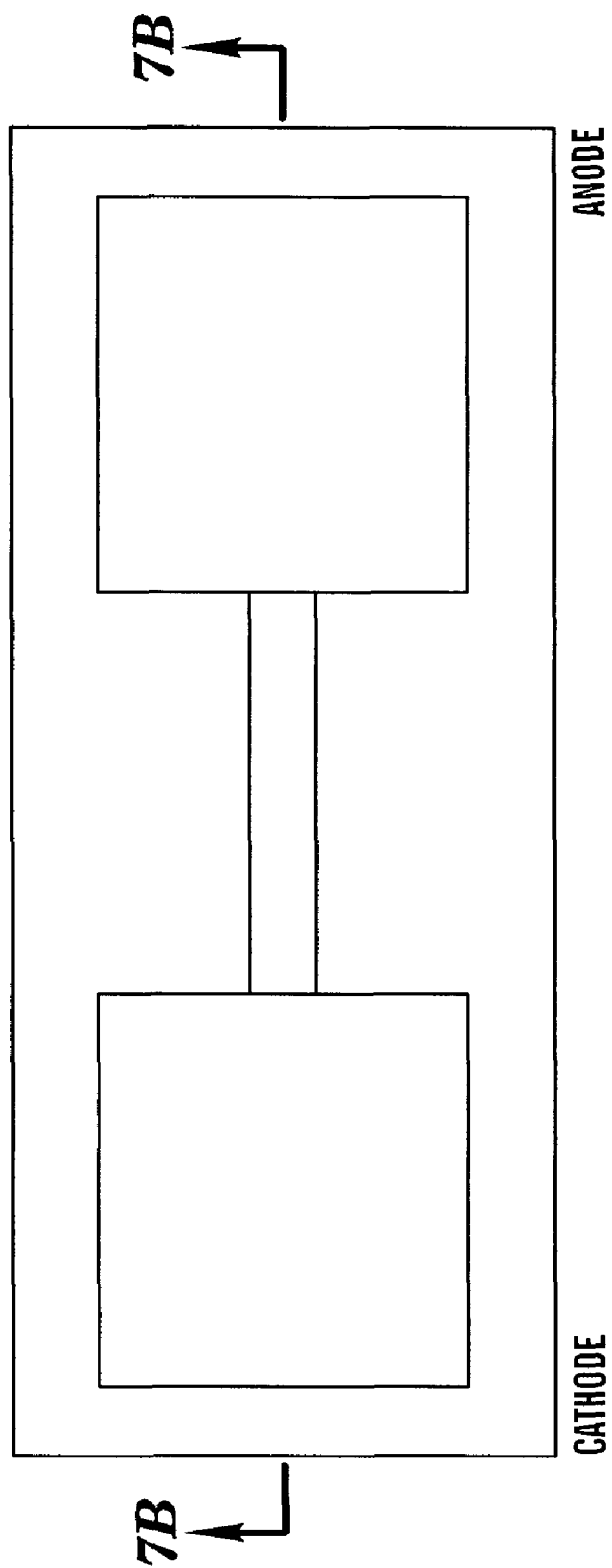
FIG. 7A is a top plan view of the intermediate structure of FIG. 6A showing silicide within the link region LR and first and second regions FR,SR.
Figure 7B:
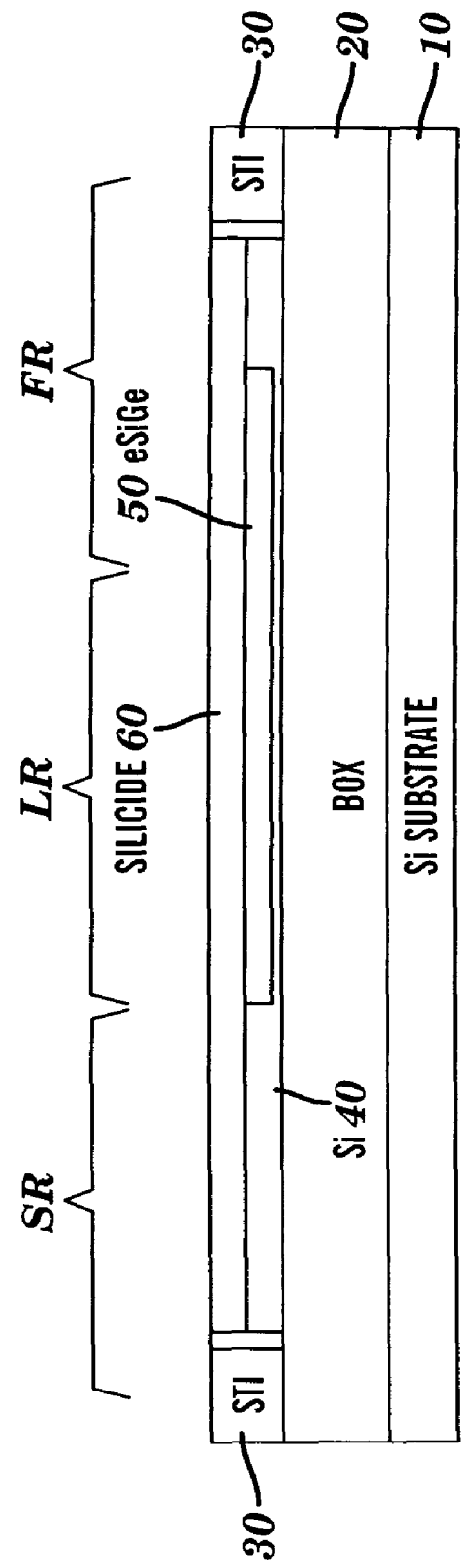
FIG. 7B is a cross-sectional view through the dashed line 7B-7B.
Figure 8A:
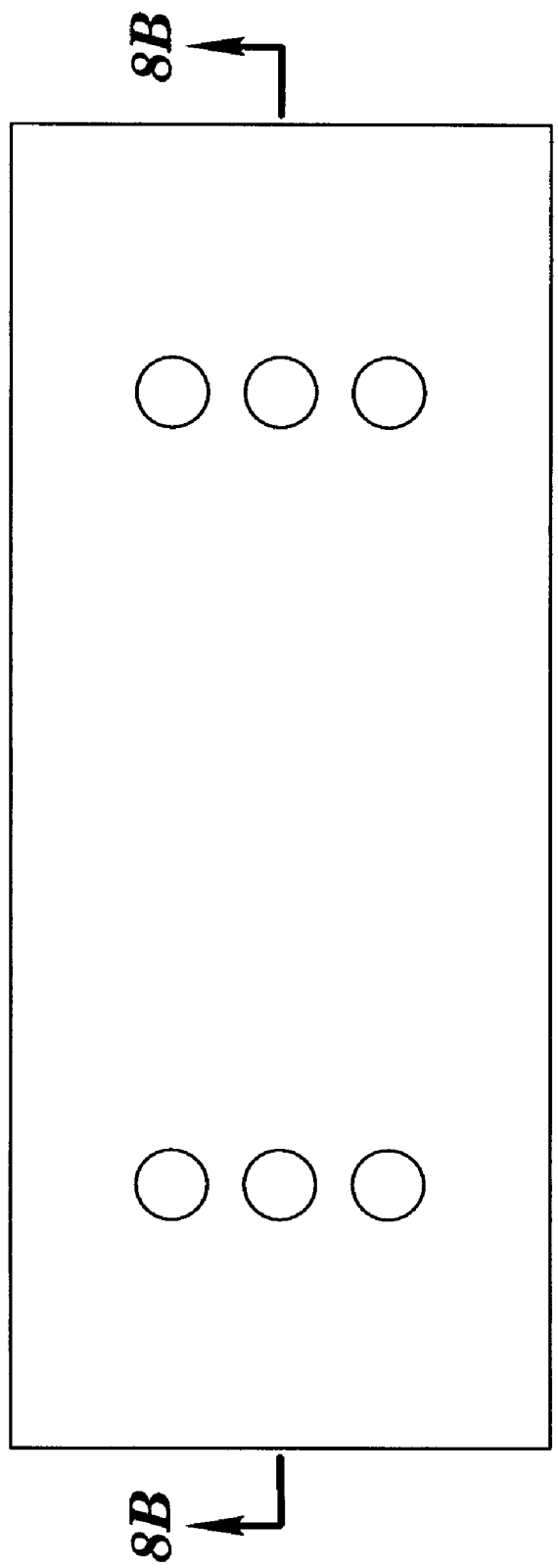
FIG. 8A is a top plan view of a final structure.
Figure 8B:
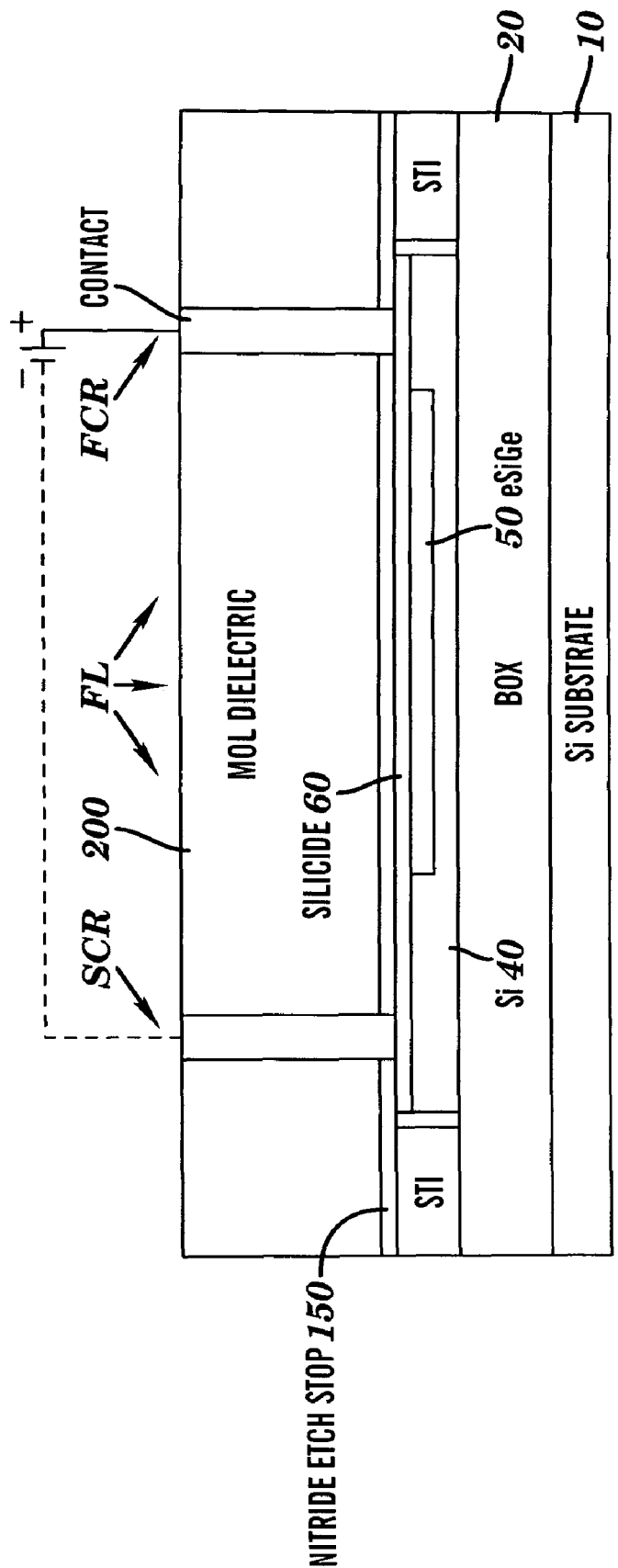
FIG. 8B is a cross-sectional view through the dashed line 8B-8B.

The area (e.g., second region SR as shown in FIG. 7B, second contact region SCR or cathode as shown in FIG. 8B, and other NFET related areas) that will not have eSiGe (embedded SiGe) is covered with a block layer such as LPCVD nitride 70. See FIGS. 5A and 5C. The nitride 70 is deposited everywhere and is etched using a RIE with a block mask in the area where SiGe should be deposited: surface area of a link region LR and part surface area of a first region FR (FIG. 7B). One region (e.g. FR) is either completely covered with SiGe or at least a surface area larger than approximately (±10%) twenty-five percent of the first region surface area FRSA is covered with SiGe. The oxide layer (i.e., the pad oxide is replaced with a sacrificial oxide, which is later replaced with a gate oxide) is etched before recessing the silicon 40. The silicon substrate 10 (or SOI layer in SOI wafer 10,20,40) is recessed or etched using RIE. And then, a SiGe layer 50 is grown on the layer 40 epitaxially using RTP (rapid thermal processing) around 700° C. The SiGe layer 50 is grown to have a final concentration of Ge in a range of approximately 5% to approximately 50%. The block nitride layer is removed in a hot phosphoric acid (H3PO4). See FIGS. 4A, 4B, 4C, and 5A, 5B, 5C. After that, a silicide layer 60 (such as NiPtSi) is formed on the SiGe layer 50. A top down view of an intermediate structure for an eFuse after the silicide process steps is shown in FIG. 6A. The corresponding cross-sectional view in the fuse-link region is shown in 6B and the cross-section corresponding to the region SR without the SiGe is shown in FIG. 6C. See also FIGS. 7A and 7B. The first region FR with the partial SiGe layer 50 is biased positively (anode) with reference to the second region SR, during programming. See also FIGS. 8A and 8B.

As shown in FIGS. 8 and 8B, an etch stop nitride layer 150 is then deposited, and a middle of the line (MOL) dielectric layer 200 such as oxide or BPSG (BoroPhosphoSilicate glass) is deposited. Top down and cross-sectional views of an eFuse after contact formation for a preferred embodiment are shown in FIGS. 8A and 8B. The number of contacts is, for example, between one and six.

The preferred embodiment of the presently inventive eFuse includes two contact regions FCR, SCR connected by a fuse link region FL. Each of the contact regions includes at least one contact. If desired, more than one contact may be formed in the contact region; thus, the contact region may be made wider than the fuse link region.

This eFuse structure with more thermally insulating SiGe below the fuse link and the anode enables very easy achievement of a high and uniform final resistance, thus avoiding deleterious effects such as insufficient programming, rupture or agglomeration and avoiding collateral damage to adjacent devices. The inventive fuse structure thus advantageously permits lower programming voltage/current and/or programming time. The eFuse structure according to embodiments of the present invention can be formed using standard CMOS technology.

Using conventional techniques, the SiGe layer 50 is directly grown over the silicon 40 in the fuse link region and over all or part of the silicon layer 40 of the anode region or, alternatively, is deposited over the entire structure and then removed from the cathode region (and, e.g., part of the anode region),e.g., using an etching step.

The substrate can either be an SOI wafer 10,20,40 or Si bulk wafer for the embodiments. In a typical SOI wafer, the semiconductor is typically silicon, but any suitable semiconductor material, such as SiGe, GaAs, InP or the like may be used. An SOI wafer having a crystalline silicon layer may be formed, for example, by starting with a crystalline silicon wafer, then implanting oxygen ions, for example, to a depth between about 100 nm to 500 nm. The implanted SOI wafer is then annealed, which results in a thin layer of silicon dioxide under a thin crystalline silicon layer. Alternatively, the structure may be formed by forming an oxide layer on a first silicon wafer and an oxide layer on a second silicon wafer, wherein at least one of the silicon wafers consists of crystalline silicon, and then bonding the two wafers along the corresponding oxide layers. Note that any orientation for the crystalline semiconductor may be used, but orientations of <100> or <110> would typically be used. It should be emphasized that the crystalline silicon layer is electrically and thermally isolated from the silicon substrate 10.

Preferably, the SiGe and silicon layers 50, 40 may be implanted with a dopant, such as boron or arsenic. In yet another alternate embodiment, one side of the crystalline SiGe and silicon layers may be implanted with boron, and the other side implanted with arsenic. The single-crystalline or polycrystalline SiGe and silicon may be doped with a P-type dopant or an N-type dopant, or may be doped to form a P-N junction. Optionally, a silicide layer is formed atop the SiGe layer, using techniques known in the art, such as deposition of silicide (e.g. by a polycide process), or by deposition of a metal such as tungsten, cobalt, Ti or the like, followed by an anneal. The SiGe and silicon layers 50, 40 may remain undoped, in which case, the silicide layer 60 may be required to achieve the desired conductivity.

The embodiment of the inventive eFuse (FIGS. 8A, 8B) is connected in series with a transistor having a select terminal through one of the contacts on one of the fuse contact regions. The other contact region on the opposite end of the fuse link is connected to a blow terminal through the corresponding contact. A blow potential of $V_B$ is applied to the blow terminal. When a programming signal or pulse $V_S$ is applied to the select terminal, a current will flow through the eFuse. A typical $V_B$ is in the range of 1.5 V to 3.3 V. A typical select or programming signal $V_S$ is a pulse with an amplitude about 1 volt to 2.5 volts, preferably about 1 volt, with a duration of about 50 microseconds to 50 milliseconds, preferably about 200 milliseconds. The inventive eFuse automatically maintains an appropriate temperature gradient for correct programming of the fuse, over such a wide range of programming voltages and programming times, and thus has a wide tolerance to programming voltage and times. The initial resistance of the fuse link is less than about (±10%) 200Ω and more typically about 100. After programming, the final resistance is greater than about 1 MΩ.

The inventive eFuse may be used in a fuse bank, which is used, for example, to store information permanently, as in a Permanent Read Only Memory. The eFuses are coupled in parallel, each connected in series to its own associated select transistor. Each eFuse is also coupled to a common blow terminal for applying the blow voltage $V_B$ in which serial latches are programmed with the pattern of fuses to be blown. Subsequent to applying the blow voltage $V_B$ to the blow terminal, appropriate digital control circuitry enables appropriate transistors, resulting in the programming of the eFuses corresponding to the pattern held in the serial latches. Appropriate sense-circuitry (e.g., SC of FIG. 1A) can be similarly integrated to read the information stored in the eFuse bank.

Figure 9:
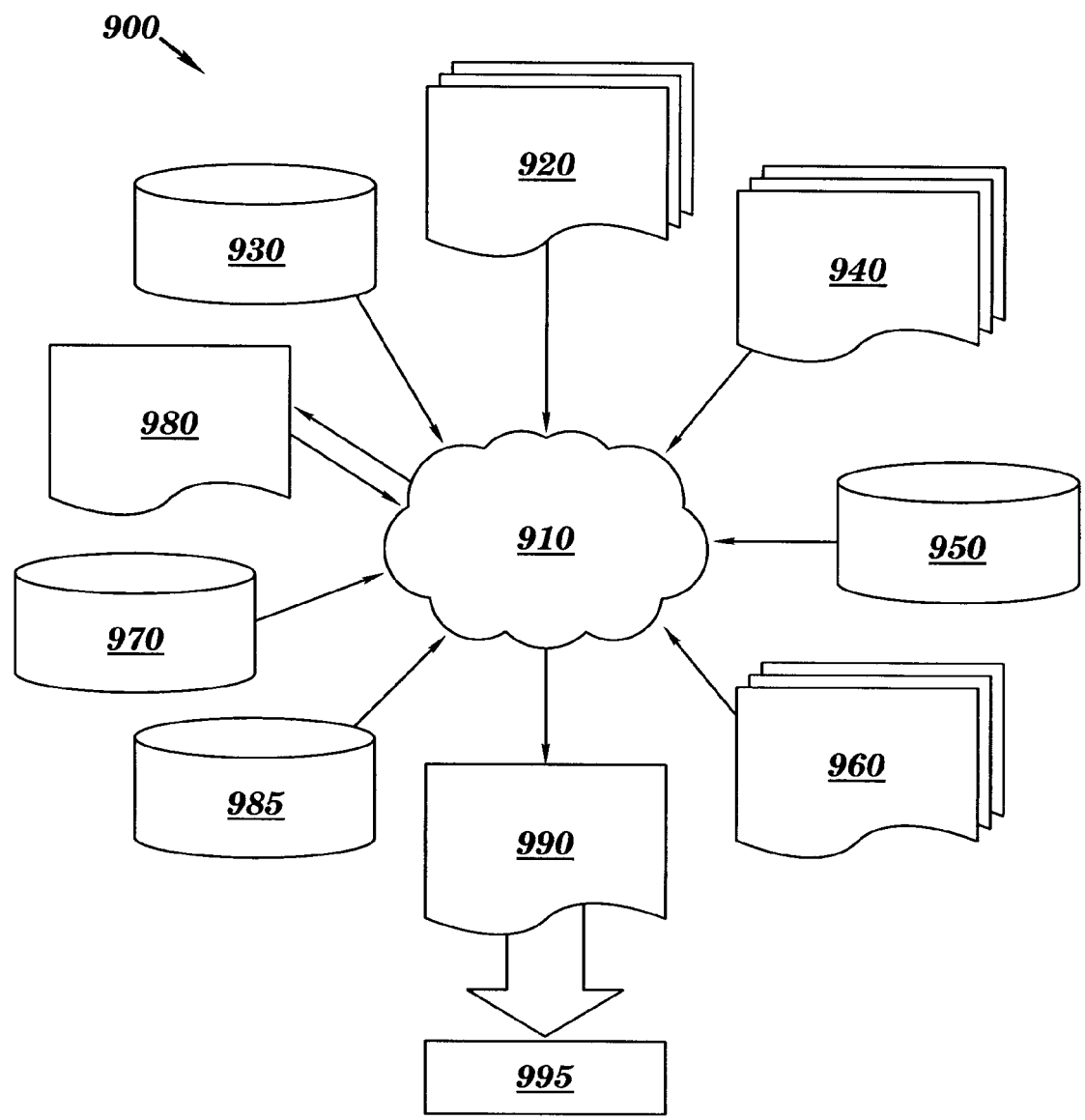
FIG. 9 is a flow diagram of a design process used in semiconductor design, manufacture and/or test in accordance with one embodiment of the present invention.

FIG. 9 shows a block diagram of an exemplary design flow 900 used, for example, in semiconductor design, manufacturing, and/or test according to the present invention. Design flow 900 may vary depending on the type of integrated circuit IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. A design structure 920 is preferably an input to a design process 910 and may come from an IP provider, a core developer, or other design company or may be generated by the operator of the design flow, or from other sources. The design structure 920 comprises an embodiment of the invention as shown in FIG. 7B or FIG. 8B in the form of schematics or HDL, a hardware-description language (e.g., Verilog, VHDL, C, etc.). The design structure 920 may be contained on one or more machine readable medium. For example, the design structure 920 may be a text file or a graphical representation of an embodiment of the invention as shown in FIG. 7B or FIG. 8B. Design process 910 preferably synthesizes (or translates) an embodiment of the invention as shown in FIG. 7B or FIG. 8B into a netlist 980, where the netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes, 28 nm, 32 nm, 45 nm, 90 nm, etc.), design specifications 940, characterization data 950, verification data 960, design rules 970, and test data files 985 (which may include test patterns and other testing information). The design process 910 may further include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the invention. The design structure of the invention is not limited to any specific design flow.

The design process 910 preferably translates an embodiment of the invention as shown in FIG. 7B or FIG. 8B, along with any additional integrated circuit design or data (if applicable), into a second design structure 990. The design structure 990 resides on a storage medium in a data format used for an exchange of layout data of integrated circuits and/or symbolic data format (e.g. information stored in a GDSII (GDS2), GL1, OASIS, map files, or any other suitable format for storing such design structures). The design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 7B or FIG. 8B. The design structure 990 may then proceed to a stage 995 where, for example, the design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, rearrangements, modifications, substitutions and variations will be apparent to those skilled in the art. Accordingly, the invention is intended to encompass all such alternatives, rearrangements, modifications, substitutions and variations which fall within the scope and spirit of the invention and the following claims.

What is claimed is:

1. A fuse, comprising:
   a fuse link region;
   a first contact region;
   a second contact region, the fuse link region electrically connecting said first contact region to said second contact region, and
   a SiGe layer disposed only in the fuse link region and the first contact region.

2. The fuse as claimed in claim 1, the first and second contact regions including copper contacts.

3. The fuse as claimed in claim 1, further comprising an electrical potential biasing the first contact region positively and the second contact region negatively.

4. The fuse as claimed in claim 1, wherein the fuse link region is elongated, and the SiGe layer is disposed along an entire length of the fuse link region.

5. The fuse as claimed in claim 1, wherein the first contact region includes a silicon layer and an insulating layer, the silicon layer having a top surface and a bottom surface, the bottom surface being disposed on the insulating layer, and wherein the SiGe layer is disposed on less than all of the top surface of the silicon layer.

6. The fuse as claimed in claim 5, wherein the SiGe layer is disposed on less than 50% of the area of the top surface.

7. The fuse as claimed in claim 5, wherein the SiGe layer is disposed on an area of the top surface, the area being within a range of approximately 25% to approximately 75% of the entire area of the top surface.

8. The fuse as claimed in claim 1, said SiGe layer consisting essentially of a single crystal silicon germanium.

9. The fuse as claimed in claim 5, said silicon layer consisting essentially of a single crystal silicon.

10. The fuse as claimed in claim 1, further comprising a silicide layer disposed on the SiGe layer.

11. The fuse as claimed in claim 1, said regions comprising a substrate, said substrate consisting essentially of a silicon-on-insulator substrate.

12. The fuse as claimed in claim 1, said regions comprising a substrate, said substrate consisting essentially of a bulk silicon substrate.

13. The fuse as claimed in claim 1, said SiGe layer including single crystal silicon germanium having a Ge concentration of approximately 25%, and said first layer consisting essentially of said single crystal silicon.

14. The fuse as claimed in claim 1, said SiGe layer being formed epitaxially.

15. The fuse as claimed in claim 1, said SiGe layer including Ge having a concentration of Ge in a range of approximately 5% to approximately 50%.

16. A design structure embodied in a machine readable medium, the design structure comprising:
    a fuse link region;
    a first contact region;
    a second contact region, the first link region electrically connecting the first contact region to the second contact region, and
    a SiGe layer disposed only in the first link region and the first contact region.

17. A semiconductor structure, comprising:
    a link region;
    a first region, and
    a second region, the link region electrically connecting the first region to the second region, wherein only the link region and the first region comprise a SiGe layer.

18. The semiconductor structure as claimed in claim 17, wherein the first region includes a first electrical contact and the second region includes a second electrical contact.

19. The semiconductor structure as claimed in claim 18, the link region further comprising a dielectric layer disposed between the first and second electrical contacts.

20. The semiconductor structure as claimed in claim 18, wherein each of the first and second electrical contacts comprises a respective copper contact.

* * * * *